United States Patent [19]
Whang et al.

[11] Patent Number: 5,642,080
[45] Date of Patent: Jun. 24, 1997

[54] LOW NOISE AMPLIFIER IN MONOLITHIC INTEGRATED CIRCUIT

[75] Inventors: In-Gap Whang; Min-Gun Kim; Choong-Hwan Kim; Chang-Seok Lee; Hyung-Moo Park, all of Daejeon, Rep. of Korea

[73] Assignee: Electronics and Telecommunications Research Institute, Daejeon, Rep. of Korea

[21] Appl. No.: 567,576

[22] Filed: Dec. 5, 1995

[30] Foreign Application Priority Data

Dec. 19, 1994 [KR] Rep. of Korea .................. 94-35166

[51] Int. Cl.⁶ ...................................... H03F 3/193
[52] U.S. Cl. ...................... 330/277; 330/286; 330/307
[58] Field of Search ............................ 330/277, 286, 330/307

[56] References Cited

PUBLICATIONS

"13-CM Gaasfet Preamp", Aug. 1984, Designed By Peter Riml.

Primary Examiner—James B. Mullins
Attorney, Agent, or Firm—Larson and Taylor

[57] ABSTRACT

A low noise amplifier of the present invention may be useful to a portable cellular phone or a microwave communication system, particularly to a monolithic circuit in which the amplifier includes an input impedance component consisting of capacitors and an inductor, two MESFETs in a cascade connection and a capacitor connected between the two MESFETs so as to enhance the stability of the amplifier when a node strapping a plurality of ground terminals of the amplifier is connected to an external circuit by means of a bonding wire.

1 Claim, 5 Drawing Sheets

Frequency 0.1 to 20.0 GHz

Frequency 0.1 to 20.0 GHz

Frequency 0.1 to 20.0 GHz

Frequency 0.1 to 20.0 GHz

LOW NOISE AMPLIFIER IN MONOLITHIC INTEGRATED CIRCUIT

BACKGROUND OF THE INVENTION

The present invention relates to a low noise amplifier which is employed in portable cellular phones or microwave communication systems, and more particularly to a low noise amplifier which is useful for a monolithic circuit in order to prevent the functional stability from being degraded due to bonding wire for connecting ground terminals which are tied up into one node to an external circuit.

In general, a low noise amplifier is referred to as a high frequency amplifying circuit for the purpose of reducing noise parameters of entire receiver circuitry which is to be used for accepting a frequency signal with a small voltage transferred through a communication line having a long length with considerable amount of waveform loss.

As shown in FIG. 1, a typical low noise amplifier includes an input impedance circuit consisting of two capacitors 11, 12 and inductor 13, and an output impedance circuit of one capacitor 26, and also includes two MESFETs (Metal— Semiconductor Field Effect Transistors) in cascade connection instead of an interposed impedance circuit at the center stage.

The low noise amplifier introduced above has been noticed to be a reliable means with a sable operating characteristic. However, when an integrated circuit such as a microwave monolithic circuit is to be arranged for structural there is a requirement of connecting signal input/output terminals, voltage input terminals and a ground terminal to an external circuit through bonding wires These bonding wires generate some degradations in performance. Namely, an inductance along bonding wire (FIG. 2) connecting a ground terminal to a ground outside of the monolithic circuit, causes the performance of the amplifier to be no longer as stable as possible in the hybrid circuit. Reference numbers 31, 32, 33 and 34 in FIG. 2 all denote bonding wires between internal terminals and the external circuit.

These results could be explained by FIG. 3, which shows an output impedance of the first MESFET 14 plotted in Smith chart, the impedance characteristic being detected at the virtual cross sectional point taken along with the line A of FIG. 2. As shown in FIG. 3, it would be apparent that when an output signal of MESFET 14 is applied to an input of MESFET 22 the functional stability becomes reduced in accordance with the expansion of the impedance plot toward an exterior of Smith chart.

For that reason, the low noise amplifier with the conventional architecture is not adaptable to a microwave monolithic integrated circuit, just resulting in several limitations against the noise reduction and the stability enhancement. Although there has been unavoidable trends to an integration of low noise amplifier in the current of the miniaturization of portable terminal equipments, a great number of trials to control the problem described above has not found any solution for them.

SUMMARY OF THE INVENTION

It is an object of the present invention to provide a low noise amplifier useful to a microwave monolithic integrated circuit and also capable of improving an operating stability, reducing an influence of inductance existed along with a bonding wire to connect ground terminals tied up in common to an external circuit.

In order to achieve the object, an amplifier according to the present invention includes the first MESFET for switching a positive voltage appeared at a drain terminal and passed through a resistor to a source terminal in response to an output signal generated from an input impedance circuit, the first impedance component having a resistor and a capacitor coupled in parallel and connected to an inductor connected to the source terminal of the first MESFET so as to control an amplifying rate of the first MESFET, a conducting resistor for carrying a signal at the drain terminal of the first MESFET to a ground after the signal was passed through a DC blocking capacitor, the second MESFET for switching a positive voltage appeared at a drain terminal and passed through an inductor to a source terminal in response to a signal voltage at the conducting resistor, the second impedance component having a resistor and a capacitor in parallel and connected to the source terminal of the second MESFET so as to control an amplifying rate of the second MESFET, and a capacitor for connecting the drain terminal of the first MESFET to a node which ties up terminals of the impedance components and of the conducting resistor in common and is connected to the ground by means of a bonding wire.

BRIEF DESCRIPTION OF THE DRAWINGS

The characteristic features of the present invention will become more apparent from the description given in further detail hereinbelow with reference to the accompanying drawings, in which.

DETAILED DESCRIPTION OF THE PREFERRED EMBODIMENTS

Preferred aspects of the present invention are discussed in turn, with reference to the accompanying appended drawings.

Figure 4:
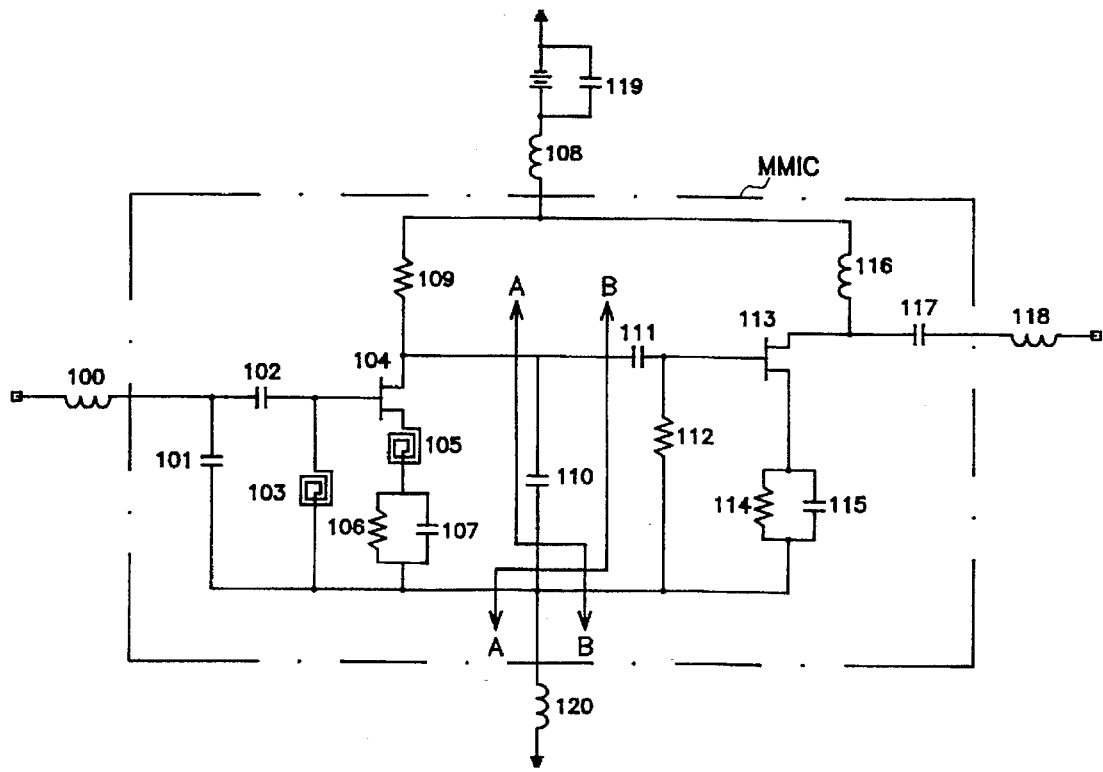
FIG. 4 is a circuit diagram of a low noise amplifier in a microwave monolithic integrated circuit according to the present invention.

FIG. 4 shows an architecture of the low noise amplifier for a microwave monolithic integrated circuit according to the present invention. In FIG. 4, reference numbers 100, 108, 118 and 120 all denote bonding wires, 101, 102, 107, 110, 111, 115, 117 and 119 represent capacitors, and 103, 105 and 116 represent inductors. The resistors in FIG. 4 are denoted by 106, 109, 112 and 114, and the MESFETs are denoted by 104 and 113.

It should be noted that even though ground terminals being tied to one or more nodes are connected to an external circuit by means of wire bonding the operating stability of the circuit can be secured therein due to capacitor 110 which is coupled between MESFETs 104 and 113 in parallel, the MESFETs being connected together in a cascade loop.

Figure 1:
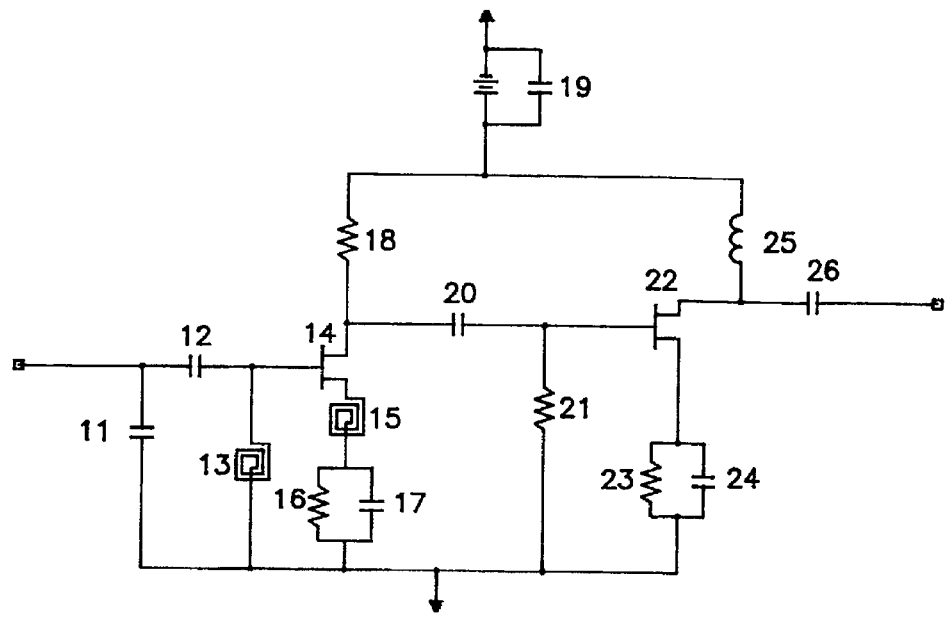
FIG. 1 is a circuit diagram of a conventional low noise amplifier.
Figure 2:
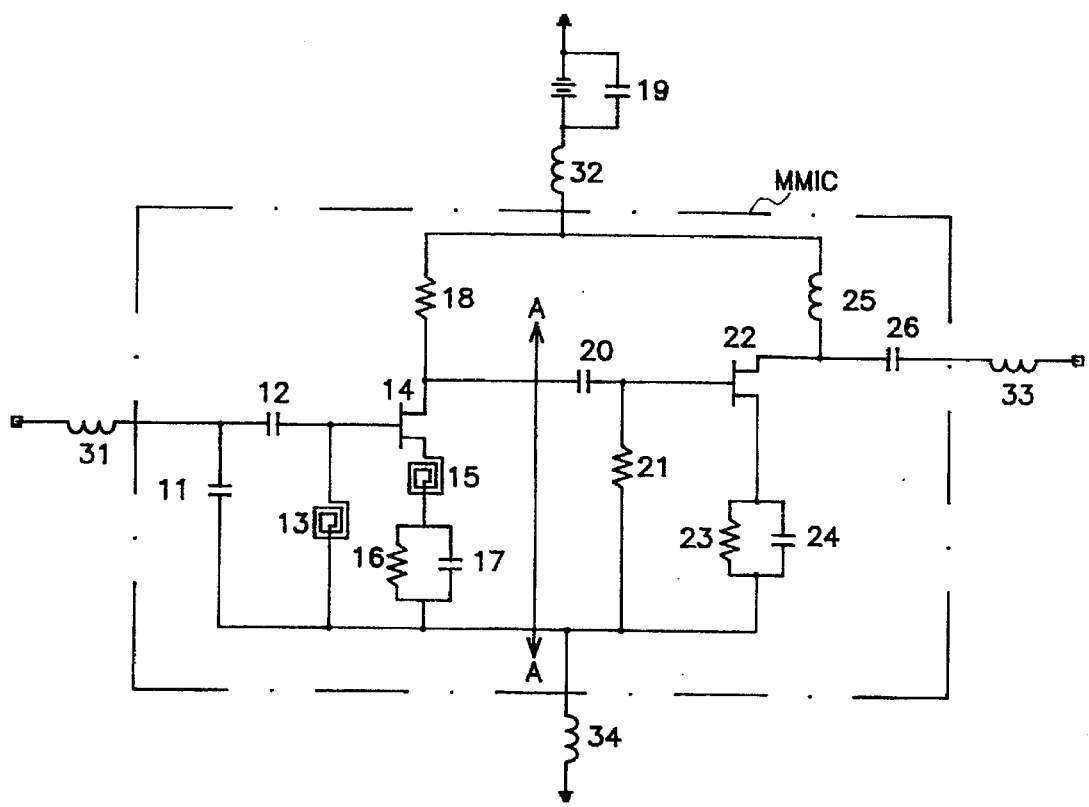
FIG. 2 is a circuit diagram of a microwave monolithic integrated circuit employing the circuit shown in FIG. 1.
Figure 3:
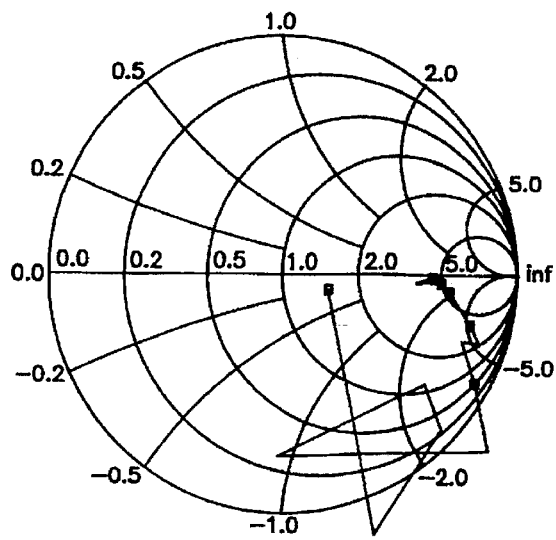
FIG. 3 shows an output impedance characteristic of MESFET 14 at the virtual cross sectional point taken along with the line A in FIG. 2.
Figure 5:
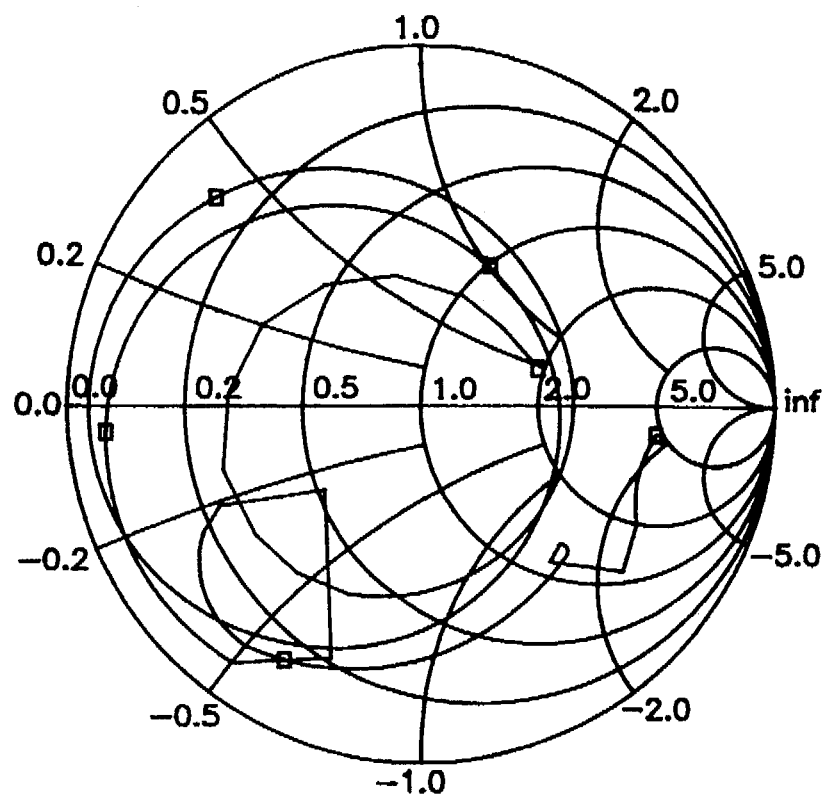
FIG. 5 shows an output impedance characteristic of MESFET 104 at the virtual cross sectional point taken along with the line A in FIG. 4.

Referring to FIG. 5 illustrating an output impedance characteristic of the first MESFET 104 at the virtual cross sectional point taken along with the line A in FIG. 4, it can be understood that the stability against the entire circuitry was laid on an admittable criterion after looking for the presence of the stability circle within Smith chart. The characteristic of the stability plotted in FIG. 5 is more advanced than that in Smith chart of FIG. 3 with an output impedance characteristic of the first MESFET 104 at the virtual cross sectional point taken along the line A in the conventional circuit of FIG. 2.

Figure 6A:
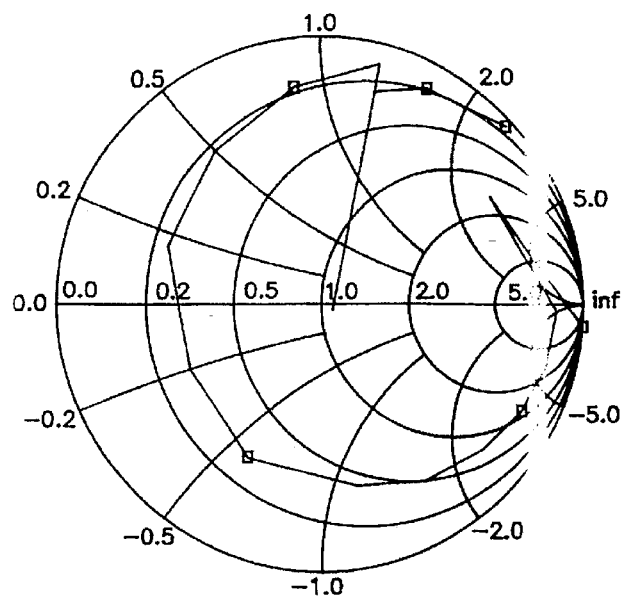
FIG. 6A shows an output impedance characteristic of MESFET 113 at the virtual cross sectional point taken along with the line B in FIG. 4.
Figure 6B:
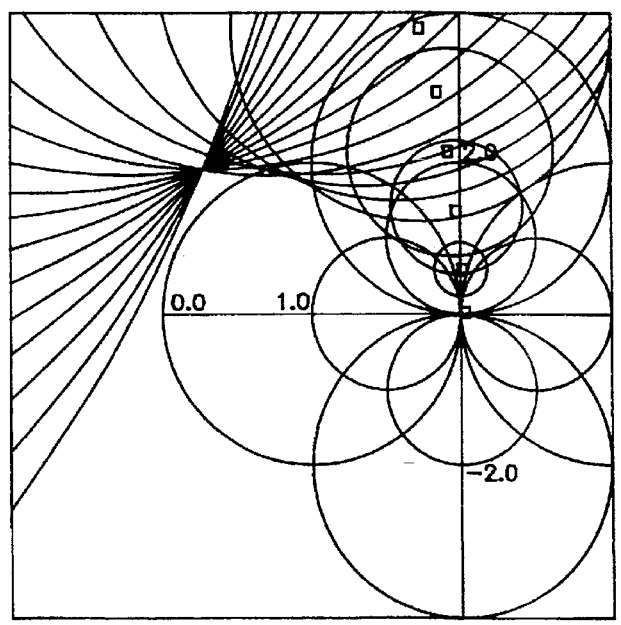
FIG. 6B shows a configuration of the stability circle evaluated on an input terminal of MESFET 113 at the virtual cross sectional point taken along with the line B in FIG. 4.

Further, comparisons between the conventional and present art as well as those relevant to the output side of the first MESFET 104 may prove the advantage of the present invention, as such is done in FIGS. 6A and 6B those respectively show the stability circles each corresponding to the output and input impedance characteristics of the second MESFET 113 at the virtual cross sectional point taken along the line B in FIG. 4.

Figure 7:
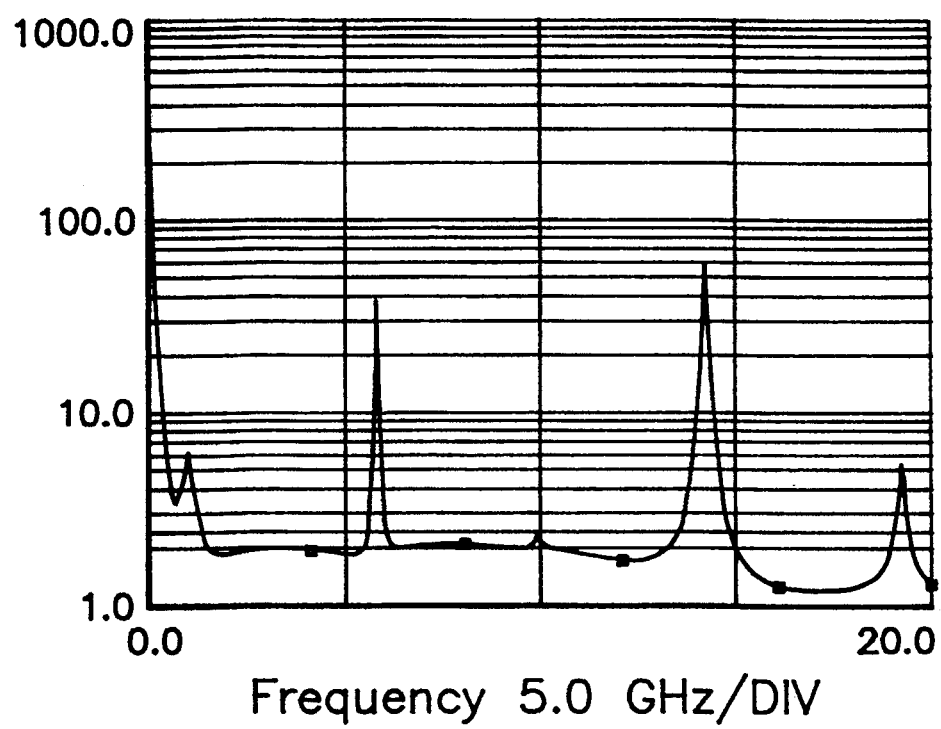
FIG. 7 represents the stability of the low noise amplifier shown in FIG. 4.

FIG. 7 represents the stability of the circuit shown in FIG. 4. The graphic diagram of FIG. 7 is explaining the variation of the stability factor K against the whole frequency band, regarding the circuit of FIG. 4 as a two-port network. As shown in FIG. 7, providing the K become larger than 1 (k>1), the two-port network can be situated in an enough condition with a sufficient stability over the whole frequency band from 0.1 to 20 GHz.

What is claimed is:

1. In an amplifier embodied in a monolithic integrated circuit and including an input impedance circuit having two capacitors and an inductor, an output impedance circuit having a capacitor, and a transistor amplifying component interposed in a cascade connection between the input and output impedance circuits, the improvement comprising:

a first resistor;

a first MESFET having a source terminal and a drain terminal for switching a positive voltage that appears at said drain terminal and is passed through said first resistor to a source terminal in response to an output signal generated from the input impedance circuit;

a first impedance component having a resistor and a capacitor coupled in parallel and connected to a first inductor connected to said source terminal of said first MESFET so as to control an amplifying rate of said first MESFET;

a conducting resistor for carrying a signal at said drain terminal of said first MESFET to a ground after said signal was passed through a DC blocking capacitor;

a second inductor;

a second MESFET having a source terminal and a drain terminal for switching a positive voltage that appears at said second MESFET drain terminal and is passed through said second inductor to said second MESFET source terminal in response to a signal voltage at said conducting resistor;

a second impedance component having a resistor and a capacitor in parallel and connected to said second MESFET source terminal so as to control an amplifying rate of said second MESFET; and a capacitor for connecting said first MESFET drain terminal to a node which connects together terminals of said first and second impedance components and of said conducting resistor in common and is connectable to a ground by means of a bonding wire.

* * * * *